United States Patent [19]

Nakagawa et al.

[11] Patent Number: 4,780,849
[45] Date of Patent: Oct. 25, 1988

[54] INFORMATION HANDLING APPARATUS HAVING MEMORY MEANS

[75] Inventors: Katsuhiko Nakagawa; Takao Kusano, both of Tokyo, Japan

[73] Assignee: NEC Corporation, Tokyo, Japan

[21] Appl. No.: 166,788

[22] Filed: Mar. 2, 1988

Related U.S. Application Data

[63] Continuation of Ser. No. 504,706, Jun. 15, 1983, abandoned.

[30] Foreign Application Priority Data

Jun. 15, 1982 [JP] Japan .............................. 57-102619

[51] Int. Cl.$^4$ .............................................. G11C 7/00
[52] U.S. Cl. ..................................... 365/189; 365/222; 364/900
[58] Field of Search ... 364/900 MS File, 200 MS File; 365/73, 77, 198, 220, 222, 244, 89, 225

[56] References Cited

U.S. PATENT DOCUMENTS

| 3,651,472 | 3/1972 | Holtey ................................ 364/200 |
| 3,919,694 | 11/1975 | Tung ...................................... 365/73 |
| 4,028,682 | 6/1977 | Weber et al. ......................... 364/900 |
| 4,441,161 | 4/1984 | Sasaki et al. ......................... 364/900 |
| 4,456,965 | 6/1984 | Graber et al. ........................ 364/900 |
| 4,464,733 | 8/1984 | Misker et al. ........................ 364/900 |

Primary Examiner—Gareth D. Shaw
Assistant Examiner—Kevin A. Kriess
Attorney, Agent, or Firm—Sughrue, Mion, Zinn, Macpeak & Seas

[57] ABSTRACT

An information handling system for a memory includes an input section, a storage section and an output section. The information handling system is constructed to selectively provide a direct signal link between the input section and the output section without storage of the transmitted signal. Control circuits are provided to selectively cause storage of data, read-out of data, data pass-through without storage or the simultaneous carrying out of a plurality of the aforementioned operations.

9 Claims, 5 Drawing Sheets

INFORMATION HANDLING APPARATUS HAVING MEMORY MEANS

This is a Continuation of application Ser. No. 504,706 filed 6/15/83, now abandoned.

BACKGROUND OF THE INVENTION

1. Field of the Invention

The present invention relates to an information-handling apparatus having memory means, and more particularly, to a data processor, such as a microcomputer including a digital IC chip on which data processing circuitry and memory circuitry are integrated and coupled to each other by signal lines called a bus; or a computer system comprising one or more processor chips, memory chips, peripheral control chips, interface chips, and peripheral devices, which are all coupled by a bus cable.

2. Description of the Prior Art

In a microcomputer, an area on the digital IC chip occupied by signal lines (buses) provided for transferring information is predominantly large as compared with an area of active elements on that IC. For example, in the digital IC chip, the proportion occupied by signal lines is at least 50% or more of the chip area, and in some case is 70 to 80%. Moreover, in an IC which is to operate with high speed processing and high performance, the number of required signal lines is increased further. Since the signal lines must be formed so as not to cause undesired interference with active elements and other signal lines, the more active elements and the signal lines there are, the less freedom there is in bus layout design. Thus, layout of a circuit pattern on an IC chip becomes difficult.

This problem with signal line layout is also present in a computer system which requires a large number of bus cables for interconnecting the various chips and the peripheral devices.

Further, the above-mentioned problem severely occurs in a data processor of a serial bus coupling system, such as in a pipeline processor, in comparison with the data processor of a common bus coupling system. This is because the serial bus system requires many roundabout routes through which data are transferred.

SUMMARY OF THE INVENTION

It is one object of the present invention to provide an information-handling apparatus in which the area occupied by signal lines is reduced without lowering performance.

Another object of the present invention is to provide an information-handling apparatus having a digital IC which is suitable for high density integration and in which design and layout of a circuit pattern is easy.

Still another object of the present invention is to provide an information processing system in which bus coupling for information transfer is easy.

Yet another object of the present invention is to provide an information-handling apparatus or system that is suitable for transferring different kinds of information through a small number of signal lines, while omitting a roundabout route.

A further object of the present invention is to provide a data processor in which a data transferring section and a data receiving section are coupled to each other via circuitry having an information storing function and a direct information transfer function.

A still further object of the present invention is to provide a data processor suitable for use in a serial bus coupling system, such as a pipeline processor.

The data processor is always provided with memory means for storing information, such as read only type memories and random access type memories. These memory means have been coupled to many signal lines, but used only for storing information. The present invention has the feature that the memory means is used as a direct path of data transfer.

The information handling apparatus having memory means according to the present invention comprises an information input portion, an information output portion, a first signal line for operatively coupling the information input and output portions with each other, an information storing circuit including therein a portion of the first signal line and coupled to a second signal line, a first control circuit for reading information out of the information storing circuit and for transferring the information to the information output portion through the second signal line, and a second control circuit for directly transferring information from the information input portion to the information output portion through the first signal line. Further, when a random access type memory is used as the information storing circuit, a third control circuit for writing information applied from the information input portion into the random access type memory may be provided in addition to the above-mentioned structure. Thus, the present invention utilizes a part of a memory means as a data line for directly transferring information from an input portion to an output portion without destroying the memory function.

According to the present invention, the external second signal line serves as a reading line or a writing line of information for the memory circuit by the first control circuit or the third control circuit, and moreover the first signal line maintains the condition where the information input portion and the information output portion are electrically coupled to the same voltage level (potential) by the second control circuit. Thus, the first signal line serves as a conventional bus through which information is directly transferred from the input portion to the output portion. Especially in the latter case, information fed to the output portion can be in itself transmitted to the output portion through the first signal line within the memory means. Moreover, since the input portion and the output portion are maintained at the same potential, information can be transferred in both directions. In other words, it is possible to transfer information from the output portion towards the input portion.

As described above, according to the present invention, information can be transferred through the interior of the memory means without providing a separate roundabout signal line. Consequently, a data receiving circuit can be coupled to the data transferring circuit using only a memory means of the present invention.

The present invention is especially effective in the following cases:

(1) in the case of feeding information within a memory as well as information other than that stored in the memory to the same receiving unit;

(2) in the case where two groups of information transferred on a time-division basis are simultaneously fed to two input portions of a processing unit such as an ALU or a comparator unit;

(3) in the case of transferring delayed information as well as information which is not delayed;

(4) in the case where a plurality of processing units are serially coupled via memories such as, for example, the case of the pipeline structure;

(5) in the case where information is written in a memory unit and at the same time the same information is transferred to a separate unit;

(6) in the case where one information is read from a memory unit and another information is transferred at the same time but at different timing; and (7) in the case where information is caused to merely pass through a memory circuit without being written into the memory circuit.

According to the present invention, in an integrated circuit, the omission of signal lines and/or reduction of in the number of contacts to signal lines is made possible. Therefore, the density of signal lines can be greatly reduced. Also, the shortcomings associated with multilayer wirings and cross-over wirings can be prevented. In addition, since the freedom of wiring is enhanced, circuit pattern layout becomes very simple. Furthermore, in an information processing system, the number of cables and the number of terminals coupling the cables can be greatly reduced, and so, there is an advantage that system construction becomes very simple. As a result, an improved integrated circuit with enhanced performance can be achieved. Furthermore, since the memory circuit of the invention can be used as a bidirectional bus, a greater freedom in circuit pattern design, particularly in regard to the positioning of circuit patterns, is achieved.

Many other advantages and benefits result by virtue of the organization recited above and are best understood and will be described in the Detailed Description of the Preferred Embodiments in association with the accompanying drawings.

DETAILED DESCRIPTION OF THE PRIOR ART

Figure 1:
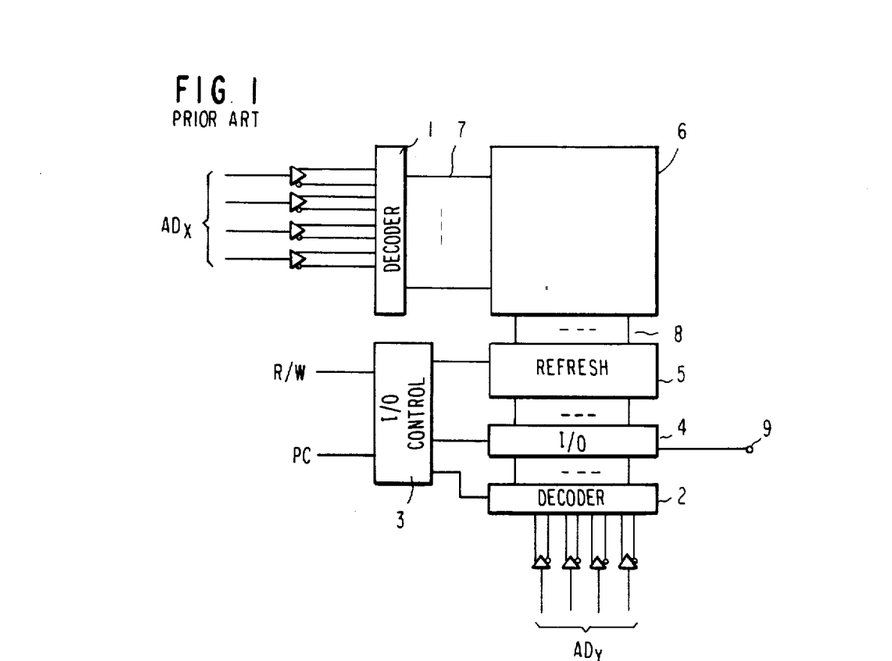
FIG. 1 is a block diagram of a known memory device, particularly of a dynamic RAM.

A block diagram of a prior art RAM that can be accessed by an 8-bit address is shown in FIG. 1. A row address $AD_X$ and a column address $AD_y$ are respectively applied to a row address decoder 1 and a column address decoder 2, and these decoders generate signals for selecting a designated cell in a memory cell matrix 6. Normally, outputs to the row address decoder 1 are coupled to the respective word lines 7, while outputs of the column address decoder 2 are coupled to the respective bit lines 8. The column decoder 2 is coupled to the memory cell matrix 6 via an input/output circuit 4 and a refresh circuit 5. Data to be written into a designated memory cell is fed through a terminal 9, and data stored in designated memory cell is derived through the same terminal 9. In other words, the terminal 9 is used as an input/output data terminal. An input/output control circuit 3 controls the refresh circuit 5, the input/output circuit 4 and the column address decoder 2 in response to a read/write control signal R/W and a precharge control signal PC.

Figure 2:
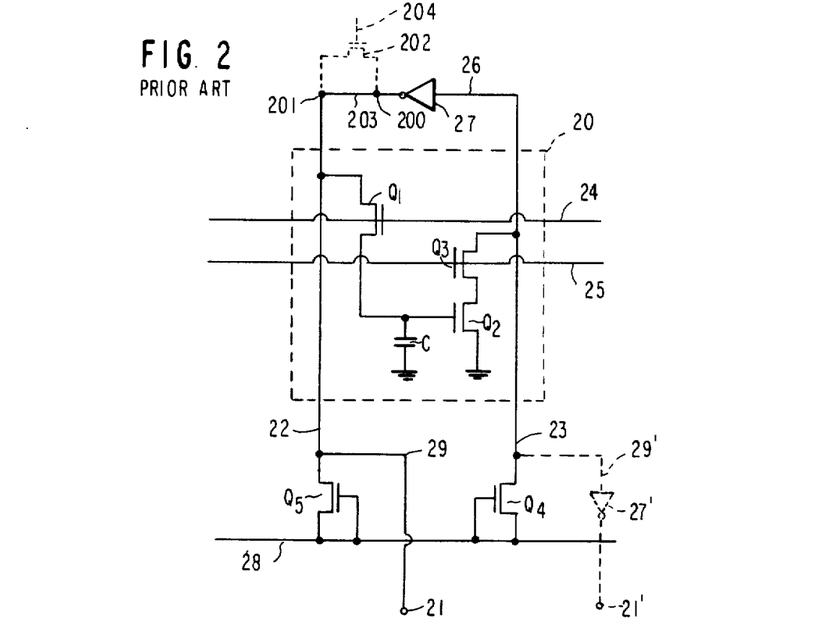
FIG. 2 is a circuit diagram showing the details of one memory cell of the dynamic RAM shown in FIG. 1.

FIG. 2 is a circuit diagram of a dynamic RAM in which each memory cell is formed of three transistors. This figure illustrates one memory cell in the dynamic RAM. A dash line block 20 shows one memory cell, in which a data write transistor $Q_1$, a data storage transistor $Q_2$ and a data read transistor $Q_3$ are arranged in the illustrated manner. Written data are stored in a capacitor C between the gate and the source of the storage transistor $Q_2$. In FIG. 2, input data are fed through an input/output terminal 21 and transferred to the memory cell 20 through a write bit line 22. When a decoded signal of a write address has been fed to a word line 24, the data on the write bit line 22 is written into the transistor $Q_2$. And when a decoded signal of a read address has been fed to a word line 25, the data stored in the transistor $Q_2$ is read via the transistor $Q_3$ onto a read bit line 23. The read data is transferred through a signal line 26 and an inverter 27, provided for the purpose of refreshing the write bit line 22, and derived from the input/output terminal 21 through a signal line 29. Upon refresh, both the transistors $Q_1$ and $Q_3$ are made active to read a datum and rewrite the read datum via the inverter 27. In the case of a three-transistor memory, since data are stored in an inverted state, upon refresh and upon reading out, the stored data must be inverted by the inverter 27. A signal line 28 is a precharge line for precharging the bit lines 22 and 23 via transistors $Q_4$ and $Q_5$.

As shown in FIG. 2, in the heretofore known RAM, the input/output common terminal 9 is coupled to the write bit line (also called digit line) 22 and read bit line so as to form a closed loop, and these lines are used as an exclusive route for writing and/or reading data to and from a memory cell. Accordingly, data to be transferred without passing through the RAM must be transmitted through a signal line which bypasses the RAM region, so as not to interfere with the RAM operation. As a result, a shortcoming occurs in that the number and lengths of signal lines are both increased and hence the region where active elements are formed is greatly restricted. In addition, since a large number of signal lines must be wired, there is the disadvantage that the design of the circuit pattern becomes difficult, while the freedom to select circuit pattern layouts is greatly restricted.

On the other hand, a dynamic RAM having a refresh control transistor is well known. The RAM of this type has a refresh control transistor 202, shown by dotted line in FIG. 2. This transistor is inserted between node 200 and node 201 instead of a signal line 203. The refresh control transistor 202 is turned on in response to a refresh control signal 204 which is periodically generated by a refresh counter at a predetermined refresh cycle. When transistor 202 is conducting the read bit line is coupled to the write bit line 22 via an inverter 27 and the refresh control transistor 202. At this point, a refresh operation is executed according to a read control signal and write control signal.

However, the RAM of this type is also used as only a memory device, and not, in any sense, are the teachings of this invention incorporated into this prior art RAM. Further, even if the write bit line 22 is decoupled from the read bit line 23 before and after a refresh operation, the write bit line 22 can not be used as a bus, because an information input portion and an information output portion are common to terminal 21.

Figure 3:
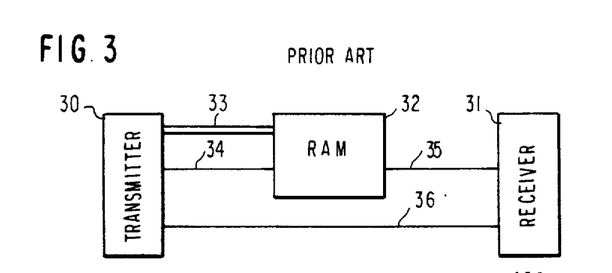
FIG. 3 is a system block diagram of a known information processor arrangement including the RAM shown in FIG. 1.

Furthermore, there is a RAM in which an information input portion is separated from an information output portion. In this case, the terminal 21 of FIG. 2 is only used as an input terminal, while a new terminal 21' coupled to the read bit line 23 by a new signal line 29' including an inverter 27' (shown in dotted line in FIG. 2) is used as an output terminal. However, to the output terminal 21' is only transferred information of the memory cell 20. Information from input terminal 21 can not be directly transferred. Conventionally, this RAM is coupled to a transmitter circuit and to a receiver circuit as shown in FIG. 3. In this figure, lines 34 and 35 are formed such that a transmitter circuit 30 may be coupled to the input terminal 21 of the RAM (shown in FIG. 2) 32 and a receiver circuit 31 may be coupled to the output terminal 21 of the RAM 32. Reference number 33 designates an address line for the RAM 32. The transmitter circuit 30 can write data into the RAM 32 through the signal line 34, and also can transmit data stored within the RAM32 to the receiver circuit 31 through the signal line 35. However, in order to transmit the data directly from the transmitter circuit 30 to the receiver circuit 31, a separate signal line 36 must be provided so as not to interfere with the RAM32. Particularly, as is well known, since a RAM area in a digital IC chip is fairly wide, the signal line 36 becomes quite long in order to avoid any interference with the RAM32.

DESCRIPTION OF THE PREFERRED EMBODIMENTS

Figure 4:
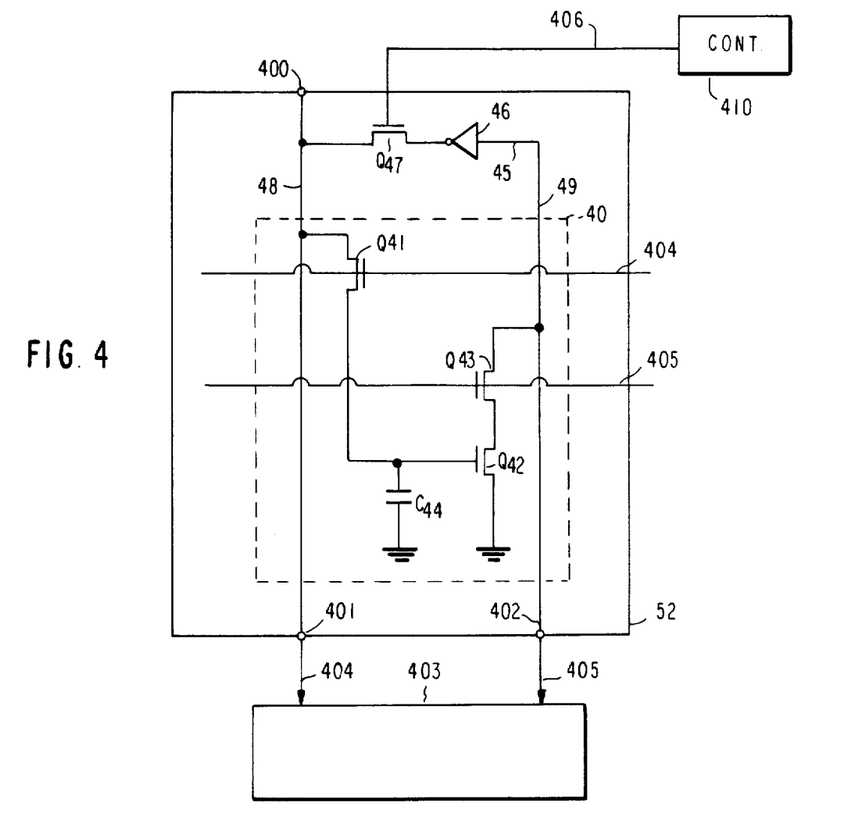
FIG. 4 is a circuit diagram of a dynamic RAM cell constructed in accordance with the teaching of the present invention.

FIG. 4 is a circuit diagram of an essential part of an improved memory according to one preferred embodiment of the present invention. In this example, a three-transistor dynamic memory is illustrated. A dash-line block 40 indicates one memory cell, which includes a write transistor $Q_{41}$, a data hold transistor $Q_{42}$ and a read transistor $Q_{43}$, and in which a datum is stored in a capacitor $C_{44}$ between the gate and the source of the transistor $Q_{42}$. Write operation of a datum is effected when a write address has been fed to a write word line 404, and read operation of a datum is effected when a read address has been fed to a read word line 405. Refresh operation is effected by reading a datum onto a read bit line 49, inverting this datum by means of an inverter 46 via a signal line 45 and then transferring the invented datum to a write bit line 48. Upon refresh, both the write transistor $Q_{41}$ and the read transistor $Q_{43}$ become active.

Besides the above-mentioned construction, in the illustrated embodiment, a transistor $Q_{47}$ serving as a switching gate transistor is provided in the refresh path. Upon refresh, this transistor $Q_{47}$ is conducting, and hence the read bit line 49 and the write bit line 48 are electrically coupled via the inverter 46. Although only one memory cell is shown in FIG. 4, other memory cells could be coupled to the bit lines and the word lines.

Write data is fed through an input terminal 400 and are stored into the cell 40 through the write bit line 48. On the other hand, the stored data is read through the read bit line 49. In FIG. 4, the write bit line 48 and the read bit line 49 are respectively provided with independent output terminals 401 and 402. More particularly, provision is made such that the write bit line 48 may be coupled to a first output terminal 401, while the read bit line 49 may be coupled to a second output terminal 402. The first and second output terminals 401 and 402 are coupled to receiving terminals of a processor circuit 403 by using signal lines 404 and 405. It is to be noted that a precharge circuit and a sense amplifier circuit that are required for a dynamic memory are omitted from the illustration for the sake of brevity.

The illustrated RAM of FIG. 4 has a specific output portion including the first output terminal 401 which is coupled to the write bit line 48 and coupled to the input terminal 400 and is separated from the input terminal 400. According to this construction, input data applied from the input terminal 400 can be directly transferred to the first output terminal 401 by using the write bit line 48 when it is not being used during a refresh operation. During the refresh operation, the switching gate transistor $Q_{47}$ becomes conductive in response to a refresh control signal which is generated from a control circuit 410 and is transferred through a signal line 406. The control circuit 410 operates in such a manner that the switching gate transistor $Q_{47}$ is held in a non-conductive state during the period when the write bit line 48 is used as a bus for directly transferring data from the input terminal 400 to the output terminal 404.

On the other hand, in all periods when the RAM is made to operate as a normal memory, the switching transistor $Q_{47}$ may be turned ON by the control circuit 410 to electrically couple the read bit line 49 and the write bit line 48 with each other. Then, data is fed through the input terminal 400 and stored in the transistor $Q_{42}$, and the stored data is transferred via the read bit line 49 to the second output terminal 402. Further, a refresh operation is also executed at every predetermined refresh cycle. While the direct data transfer is executed, the switching transistor $Q_{47}$ is turned OFF by the control circuit 410. The write bit line 48 and the read bit line 49 are electrically disconnected from each other. Accordingly, under this condition, the write terminal 400 and the first output terminal 401 assume the same potential. In other words, the write bit line 48 is decoupled from the refresh circuit, and it is ready to be used as a signal bus line. Under this condition, date input through the input terminal 400 is in itself transferred to the first output terminal 401 through the write bit line 48. Accordingly, the write bit line 48 within the memory can be used as an independent signal line without requiring a separate signal line outside of the memory.

By driving outputs from the write bit line 48 and the read bit line 49, respectively, as shown in FIG. 4 and also by providing the switching transistor $Q_{47}$ for electrically isolating the respective bit lines from each other as shown in FIG. 4, the following unique operations can be achieved.

Firstly, by turning OFF the transistor $Q_{47}$ by means of a control circuit 410 and by making the word lines 404 and 405 inactive (to turn OFF the transistors $Q_{41}$ and $Q_{42}$), the write bit line can be used as one signal line That is the write bit line 48 is available as a bus.

Secondly, by turning OFF the switching transistor $Q_{47}$ and the read transistor $Q_{43}$ and turning ON the write transistor $Q_{41}$, it is possible for data fed through the input terminal 400 to be transferred to the first output terminal 401 while the same data is simultaneously stored in the memory cells.

Thirdly, by turning OFF the switching transistor $Q_{47}$ and the write transistor $Q_{41}$ and turning ON the read transistor $Q_{43}$, it is possible for data fed through the input terminal 400 to be directly transferred to the first output terminal 401 while data stored in the memory cells are simultaneously transferred to the second output terminal 402. In other words, two kinds of data can be simultaneously output from the memory.

It is to be noted that instead of deriving the data on the read bit line through the second output terminal 402, it could be derived through the first output terminal 401 via the refresh path and the write bit line 48 by turning on the transistor $Q_{47}$ with a control signal from the control circuit 410. In this case, since there is only one output from the memory, it is impossible to simultaneously output two kinds of data. However, even in this case, the advantage of using the write bit line 48 as a signal line is not lost.

Figure 5:
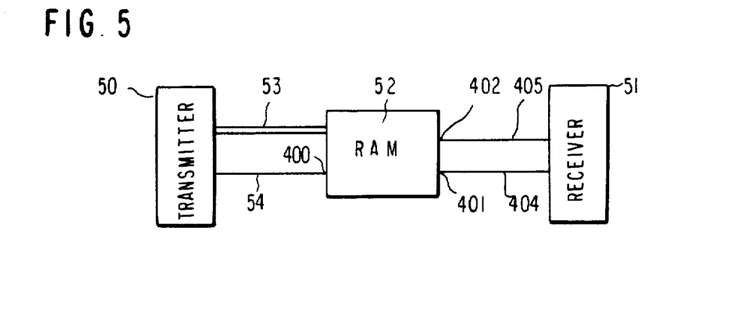
FIG. 5 is a system block diagram of an information processor having the dynamic RAM shown in FIG. 4 included therein.

If the RAM 52 shown in FIG. 4 is used, a circuit equivalent to that shown in FIG. 3 can be constructed with a pattern layout as shown in FIG. 5. In this figure, a transmitter circuit 50 is coupled to a receiver circuit 51 only through a RAM 52, and thereby the following operations can be executed. The transmitter circuit 50 can transmit data stored within the RAM 52 to the receiver circuit 51 via a data bus 405 by transferring an address through an address bus 53 to the RAM 52, and also it can write data in the RAM 52 via a data bus 54 coupled to the input terminal 400. Furthermore, the transmitter circuit 50 can directly feed data to the receiver circuit 51 by transmitting data through the interior of the RAM 52 and the bus 404 coupled to the first output terminal 401 without requiring a separate bus 36 shown in FIG. 3. Accordingly, bus forming becomes very simple as a compared to the prior art shown in FIG. 3, and hence substantial freedom is attained in pattern layout.

Figure 6:
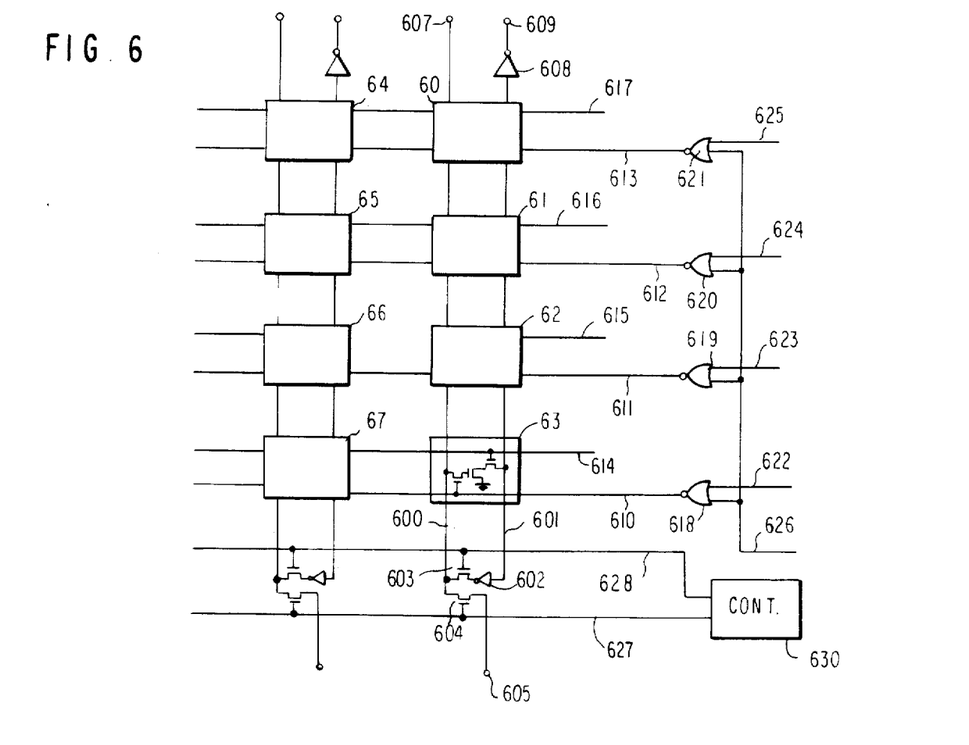
FIG. 6 is a circuit diagram of another preferred embodiment of the present invention as applied to a dynamic RAM.

FIG. 6 is a block diagram of another preferred embodiment of the present invention. This figure shows eight memory cell blocks 60–67, and each cell includes three transistors as shown within the block 63 (corresponding to the block 40 of FIG. 4). The respective cells are coupled in common to a write bit line 600 (corresponding to the line 48 of FIG. 4) and a read bit line 601 (corresponding the line 49 of FIG. 4). The read bit line 601 is coupled to the write bit line 600 via an inverter 602 (corresponding to the inverter 46 in FIG. 4) and a transistor 603 (corresponding to the transistor $Q_{47}$ of FIG. 4) for refresh control. The write bit line 600 is coupled to a data input terminal 607 (corresponding the terminal 400 of FIG. 4), and further coupled to a data output terminal 605 (corresponding the terminal 401 of FIG. 4) via a switching transistor 604. This output terminal 605 may be coupled to a processor circuit (not shown). On the other hand, the read bit line 601 is coupled to another output terminal 609 (corresponding to the terminal 402 in FIG. 4) via an inverter 608. Write transistors in the respective cells are coupled to write word lines 610–613 (610 corresponds to the line 404 of FIG. 4), and read transistors are coupled to read word lines 614–617 (614 corresponds to the line 405 of FIG. 4), respectively. The write word lines are coupled to output ends of NOR gates 618–621, respectively. To one input of each NOR gate is fed decoded signals 622–625 of a write address, while the other input is adapted to receive a write inhibit signal 626. The switching transistor 604 is controlled by a control signal fed through a gate signal line 627. This gate signal line 627 and a refresh signal line 628 (corresponding to 406 of FIG. 4) are coupled to a control circuit 630.

In the RAM shown in FIG. 6, the write bit line 600 can be coupled to the output terminal 605 by turning ON the transistor 604. As a result, the data input terminal 607 and the output terminal 605 assume the same potential, and hence the write bit line 600 can be used as an independent signal line. Moreover, since the data input terminal 607 and the output terminal 605 are held at the same potential, the write bit line 600 can be used as a bidirectional signal line. In other words, it is also possible to input data from the output terminal 605 and to take out the data from the input terminal 607. The times when the write bit line 600 can be used as a signal line is limited to times other than the time for the memory refresh cycle. Since refresh of the memory is made possible by turning ON the refresh control transistor 603, the transistor 604 can be controlled by an inverted refresh control signal.

Furthermore, when the write bit line 600 in FIG. 6 is used only as a signal line, the transistor 603 is turned OFF and the write word lines 610–613 are also made inactive. Although the write word lines 610–613 are inactive unless write addresses 622–625 are fed to these write word lines 610–613, a write address register (not shown) is normally constructed in such manner that undesired signals cause it to be maintained in its set state even during a period other than the write cycle. Accordingly, it is preferable that as shown in FIG. 6 there are provided NOR gates 618–621 adapted to receive an inhibit signal via a signal line 626 so as to inhibit the write addresses from being transferred to the respective word lines. If such provision is made, the write transistors in the respective memory cells are all made inactive simultaneously, and the write bit line is freed from the memory cells.

While the data read from the cells are adapted to be taken out from the output terminal 609 in the illustrated embodiment, the output of the inverter 608 could be coupled to the write bit line 600. In this case, the output terminal 609 can be omitted, and the data stored in the cells can be taken out either through the input terminal 607 or through the output terminal 605.

Figure 7:
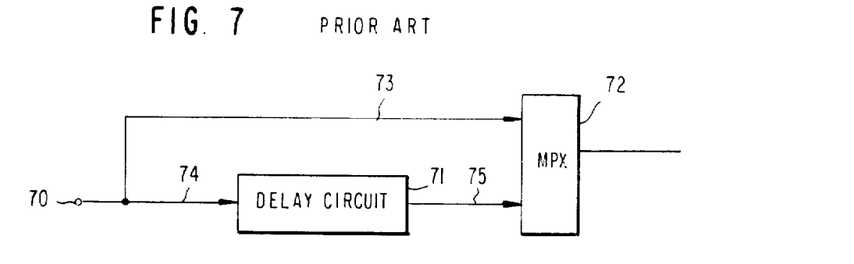
FIG. 7 is a block diagram of a prior art processing circuit having a delay circuit therein.
Figure 8:
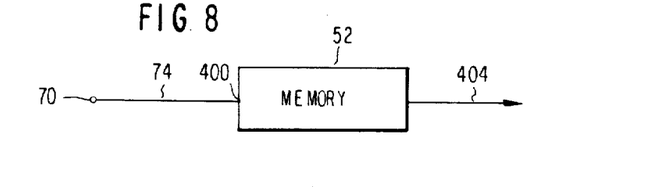
FIG. 8 is a block diagram of still another preferred embodiment of the present invention as applied to a delay circuit section.

If the RAM shown in FIGS. 4 or 6 is employed, a prior art circuit shown in FIG. 7 can be modified as shown in FIG. 8. FIG. 7 shows a circuit pattern in which data from an input end 70 is either directly transferred through a signal line 73 or its is transferred after having been delayed by a delay circuit 71 to a multiplexer 72 where it is switched. In the prior art, the signal line 73 had to be provided outside of the delay circuit 71 whose input portion is coupled to a signal line 74 and whose output portion is coupled to a signal line 75.

However, if the RAM shown in FIG. 4 is employed, the equivalent circuit is achieved by the circuit shown in FIG. 8, The input end 70 is coupled to the memory 52 shown in FIG. 8 via the signal line 74. The output of the multiplexer 72 corresponds to the output of the memory 52, which is transferred through the signal line 404.

Data required to be delayed can be temporarily stored in the cell of the memory 52 and can be taken out of the memory through the writs bit line 45 of FIG. 4 after the delay time passes. Data which need not be delayed can be directly transferred through the write bit line 48 to the signal line 404. Therefore, no signal line 73 and no multiplexer 72 are required. However, if both a delayed data and a no delayed data are simultaneously to be outputted, the second out terminal 402 and the signal line 405 would be required.

Figure 9:
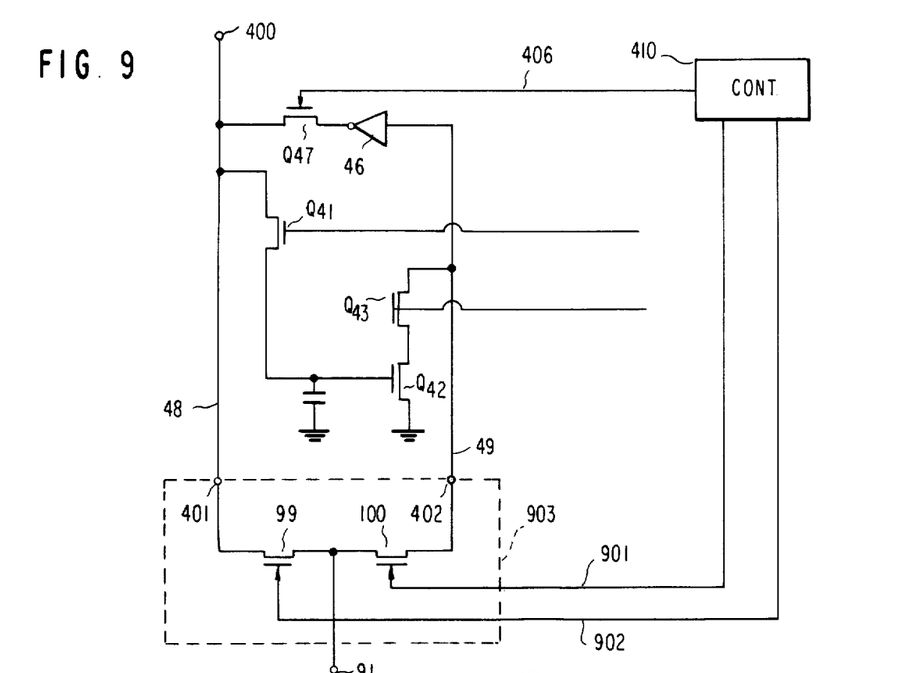
FIG. 9 is a circuit block diagram of the embodiment of the invention shown in FIG. 8 with the dynamic RAM outputs connected to a multiplexer.

Furthermore, in the event data to be transferred through the system of FIG. 8 is only sequential data, a circuit could be constructed as shown in FIG. 9. In this figure, a temporary memory circuit is formed of transistors $Q_{41}$, $Q_{42}$ and $Q_{43}$. Reference numeral 400 designates an input end, and numeral 91 designates an output end. In the case where data fed through the input end 400 are directly taken out through the output end 91, the transistor $Q_{47}$ is turned OFF by a control signal 406 which is sent from the timing control circuit 410, while a transistor 99 within a multiplexer 903 is turned ON by a control signal 902 to thereby couple a bit line 48 to the output end 91. On the other hand, in the case where delayed data are taken out through the output end 91, after the data has been temporarily stored in the cell, a transistor 100 is turned ON by a control signal 901 to couple a bit line 49 to the output end 91. In the case of a long delay time, it is only additionally required to turn ON the transistor $Q_{47}$ for refreshing the data via an inverter 46. Here, since the delayed data which is transferred to the output end 91 via the transistor 100 is inverted, a new inverter (not shown) is required to invert data in the cell. However, if the inverter 46 is used to transfer the delayed data through the bit line 48 to the output end 91, the new inverter and the transistor 100 should be omitted. In this case, the refresh transistor $Q_{47}$ has to be turned ON by a control signal 406 generated by the control circuit 410. Of course, the transistor 99 is also turned ON in response to the control signal 902.

Figure 10:
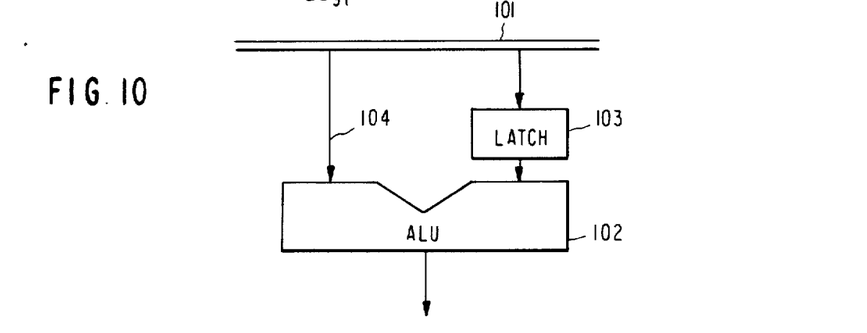
FIG. 10 is a block diagram of a prior art processing circuit including an ALU.
Figure 11:
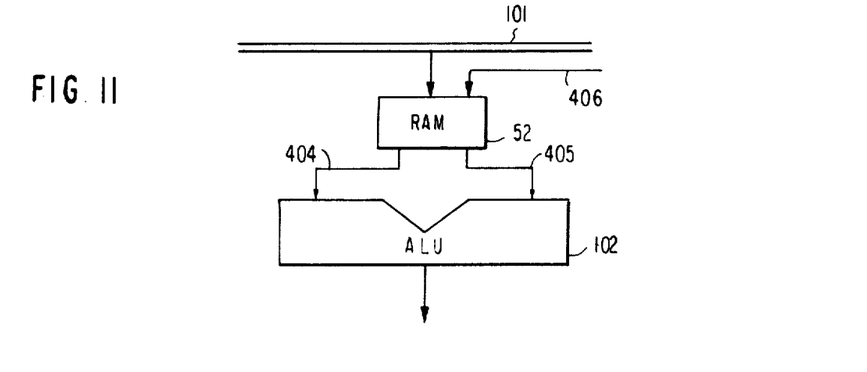
FIG. 11 is a block diagram of a still further preferred embodiment of the present invention as applied to a processing circuit including an ALU.

Still further, in a microprocessor IC, it is sometimes desired that data incoming on a time-division basis through a data bus 101 be processed in an ALU 102 and then outputted from the ALU as shown in FIG. 10. In the prior art, in such cases a latch 103 and a signal line 104 were always required. However, if a RAM (as shown in FIG. 4) according to the present invention is employed, the signal line 104 and the latch 103 shown in FIG. 10 becomes unnecessary as illustrated in FIG. 11.

More particularly, it is only required to couple a data bus 101 to an ALU 102 via a RAM 52 according to the present invention. The data to be latched in the latch 103 is temporarily stored in the cell or the RAM 52, while the data which later comes in through the data bus 101 is passed through the RAM 52 and are output through a signal line 404. At this moment, the previously stored data is simultaneously output through a signal line 405.

Figure 12:
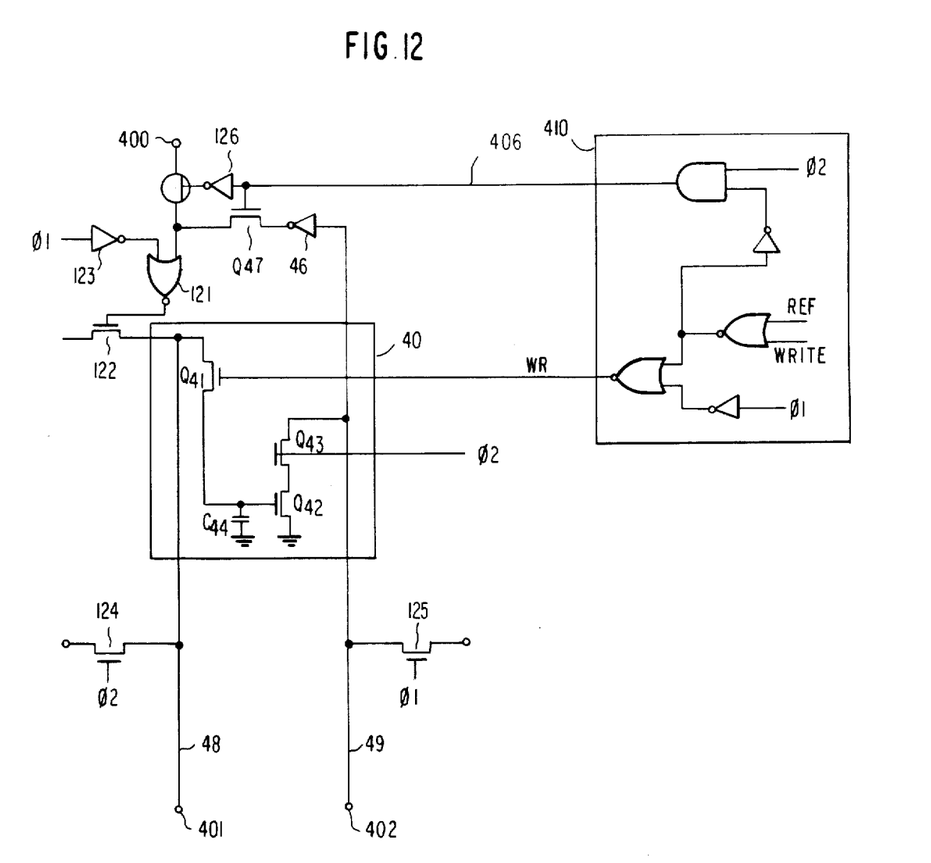
FIG. 12 is a circuit diagram of still another preferred embodiment of the present invention.

FIG. 12 is a more detailed embodiment of FIG. 4. The illustrated circuit includes a memory cell 40, a refresh circuit (a transistor $Q_{47}$ and an inverter 46), a write bit line 48, a read bit line 49 and a control circuit 410. A data input terminal 400 is coupled to the write bit line 48 via a switching gate 120, a NOR gate 121 and a transistor 122. The NOR gate 121 receives a timing pulse $\phi_1$, through an inverter 123. Transistors 124 and 125 are precharge transistors for the write bit line 48 and the read bit line 49, respectively, and operate in response to two kinds of clock pulses $\phi_2$ and $\phi_1$. The control circuit 410 receives the clock pulses $\phi_1$ and $\phi_2$, a refresh signal (REF) and a write signal (WRITE) and outputs a control signal 406 and a write control signal (WR). The control signal 406 is applied to the refresh transistor $Q_{47}$ and to the switching gate 120 through an inverter 126.

Figure 13:
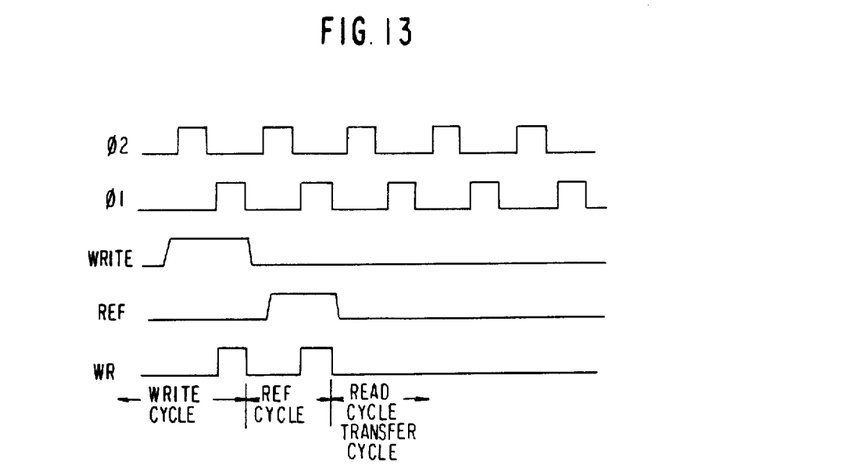
FIG. 13 is a timing chart for the circuit of FIG. 12.

FIG. 13 is a timing chart illustrating the operation of the circuit of FIG. 12. In a write cycle, the write signal WR is applied to the transistor $Q_{41}$. The refresh signal is applied to the transistor $Q_{47}$ as the control signal 406 in synchronism with the clock pulse $\phi_2$ during a refresh cycle. During this state, the switching gate 120 is turned OFF, and any input datum is inhibited. When no write signal and no refresh signal exist, the circuit is set in a read cycle mode. During this state, the input terminal 400 is coupled to the output terminal 401, and therefore, the write bit line 49 can be used as a bus line through which data is directly transferred.

As described above, the present invention provides the advantage of freeing a bit line from a memory circuit, where upon the bit line can be used as a discrete bus. Accordingly, a number of buses used in an IC or the like can be greatly reduced, and freedom in regards to pattern layout can be enhanced. It is to be noted that while an example in which a write bit line is used as a bus has been described in connection to the aforementioned embodiments, if a switching transistor is provided in a read bit line, obviously this read bit line can be used as a bus. Furthermore, the present invention could be applied not only to an IC but also to a computer system. In addition, if data take-out sections are provided at both ends of a ROM bit line and if this bit line is freed from the ROM cells by inhibiting the addressing of the ROM, then a ROM bit line can be used as a bus in a manner similar to the present invention. Moreover, even in connection to RAM's, the present invention is equally applicable to RAM's of the types other than the three-transistor dynamic memory such as, for example, a two transistor-type memory, a one-transistor memory and the like, and to a static type memory.

What is claimed is:

1. A memory comprising an input terminal adapted to receive a digital signal, a write bit line having one end coupled to said input terminal, a plurality of memory cells connected in parallel to said write bit line, each of said memory cells storing a digital signal transferred through said write bit line from said input terminal, said plurality of memory cells being spatially arrayed in a line, said write digit line running from its one end to its other end via said plurality of spatially arranged memory cells along said line, means for writing the digital signal transferred through said write bit line from said input terminal to a selected one of said memory cells, a read bit line to which said plurality of memory cells are connected in parallel and which runs via said plurality of spatially arrayed memory cells along said line, a first output terminal coupled to said read bit line, means for reading the digital signal stored in a selected one of said plurality of memory cells to said read bit line, the read-out digital signal being transferred through said bit line and derived from said first output terminal, a second output terminal, and means including a switch for operatively connecting said other end of said write bit line to said second output terminal to bypass a digital signal received at said input terminal directly to said second output terminal through said write bit line via said plurality of spatially arrayed memory cells.

2. A memory as claimed in claim 1, further comprising means for transferring a signal from said read bit line to said write bit line for refresh.

3. A memory as claimed in claim 2, further comprising means for controlling said transferring means and said connecting means such that said transferring means is inactivated when said switch is activated.

4. A memory as claimed in claim 2, wherein each of said memory cells includes a first field effect transistor, one end of the source-drain path thereof being connected to said write bit line, the gate of said first field effect transistor being connected to said writing means, a second field effect transistor, one end of its source-drain path being connected to said read bit line, the gate of said second field effect transistor being connected to said reading means, and a third field effect transistor one end of its source-drain path being connected to the other end of the source-drain path of said second field effect transistor, the gate of said third field effect transistor being connected to the other end of the source-drain path of said first field effect transistor.

5. A memory comprising an input terminal adapted to receive a digital signal, a first bit line, means for connecting one end of said first bit line to said input terminal, a plurality of dynamic memory cells connected to said first bit line and temporarily storing a digital signal transferred through said first bit line from said input terminal, means for writing a digital signal on said first bit line to a selected one of said dynamic memory cells, a refresh circuit coupled to said first bit line for operatively determining a level of said first bit line in accordance with a level of one of said dynamic cells to be refreshed, said one of said dynamic memory cells being refreshed through said first bit line, means coupled to said dynamic memory cells for reading the stored digital signal from a selected one of said memory cells, a first output terminal receiving the digital signal read from the selected one of said memory cells, a second output terminal, means for connecting the other end of said first bit line to said second output terminal for bypassing a digital signal received at said input terminal to said second output terminal via said first bit line, and means for inactivating said refresh circuit when the digital signal is bypassed to said second output terminal, whereby said first bit line becomes a multifunctional line for writing, for refreshing and for bypassing.

6. A memory as claimed in claim 5, wherein said reading means includes a second bit line connected in parallel to said dymanic memory cells and to said first output terminal to transfer the digital signal read out of the selected one of said dynamic memory cells to said first output terminal, and said refresh circuit includes a switching means coupled between said first bit line and said second bit line.

7. An information handling apparatus comprising a memory haivng an input terminal adapted to receive a digital signal, a write bit line connected to said input terminal for transferring the digital signal received at said input terminal therethrough, a plurality of memory cells connected in parallel to said write bit line for storing a digital signal written thereinto, a read bit line to which said memory cells are connected in parallel, a first output terminal connected to said read bit line, means for writing into a selected one of said memory cells the digital signal which is received at said input terminal and is transferred through said write bit line, means for reading the digital signal stored in a selected one of said memory cells to said read bit line, the read-out digital signal being transferred through said read bit line and derived from said first output terminal, a second output terminal, a refresh circuit coupled between said write bit line and said read bit line for operatively determining a level of said write bit line in accordance with a level of said read bit line to thereby refresh the content of one of said memory cells by the determined level of said write bit line in a refresh operation, control means for disabling said refresh circuit, and means for connecting said write bit line to said second output terminal for causing a digital signal received at said input terminal to be directly transferred to said second output terminal through said write bit line without being stored in any one of said memory cells, and a logic unit having a first input terminal coupled to said first output terminal of said memory, a second input terminal coupled to said second output terminal of said memory, and a logic circuit for performing an arithmetic operation on a digital signal directly transferred from said input terminal of said memory to said second input terminal of said logic unit through said write bit line when said refresh circuit is disabled and a digital signal stored in said memory cell and transferred to said first input terminal of said logic unit through said read bit line of said memory.

8. An information handling apparatus as claimed in claim 7, wherein the digital signal is directly transferred to said second output terminal through said write bit line simultaneously with a read operation for reading the stored digital signal out of a selected one of cells.

9. An information apparatus as claimed in claim 7, wherein said refresh circuit includes an inverter having an input and coupled to said read bit line and a transfer gate coupled between said write bit line and an output end of said inverter.

* * * * *

UNITED STATES PATENT AND TRADEMARK OFFICE
CERTIFICATE OF CORRECTION

PATENT NO. : 4,780,849
DATED : October 25, 1988
INVENTOR(S) : Katsuhiko NAKAGAWA et al It is certified that error appears in the above-identified patent and that said Letters Patent is hereby corrected as shown below:

COLUMN 8, LINE 67　　Delete "its is" and insert
　　　　　　　　　　　　--it is--.

COLUMN 9, LINE 14　　Delete "writs" and insert
　　　　　　　　　　　　--write--.

COLUMN 9, LINE 14　　Delete "line 45" and insert
　　　　　　　　　　　　--line 48--.

Signed and Sealed this

Twentieth Day of June, 1989

Attest:

DONALD J. QUIGG

Attesting Officer　　　Commissioner of Patents and Trademarks